US012706690B2

(12) United States Patent
Tong et al.

(10) Patent No.: US 12,706,690 B2
(45) Date of Patent: Aug. 11, 2026

(54) POLAR CODE CONSTRUCTION METHOD AND APPARATUS

(71) Applicant: HUAWEI TECHNOLOGIES CO., LTD., Shenzhen (CN)

(72) Inventors: Jiajie Tong, Hangzhou (CN); Huazi Zhang, Hangzhou (CN); Shengchen Dai, Hangzhou (CN); Xianbin Wang, Hangzhou (CN); Rong Li, Boulogne Billancourt (FR); Jun Wang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 334 days.

(21) Appl. No.: 18/399,870

(22) Filed: Dec. 29, 2023

(65) Prior Publication Data

US 2024/0137152 A1 Apr. 25, 2024
US 2024/0235732 A9 Jul. 11, 2024

Related U.S. Application Data

(63) Continuation of application No. PCT/CN2022/099032, filed on Jun. 15, 2022.

(30) Foreign Application Priority Data

Jun. 30, 2021 (CN) ......................... 202110738492.4

(51) Int. Cl.
*H04L 1/00* (2006.01)
*H03M 13/15* (2006.01)
*H04W 28/04* (2009.01)

(52) U.S. Cl.
CPC .......... *H04L 1/0057* (2013.01); *H03M 13/15* (2013.01); *H04W 28/04* (2013.01)

(58) Field of Classification Search
CPC ... H04L 1/0057; H04L 1/0041; H04L 1/1819; H04L 1/0043; H03M 13/15;
(Continued)

(56) References Cited

U.S. PATENT DOCUMENTS

2018/0323803 A1* 11/2018 Palgy .................... H04L 1/0057
2019/0356342 A1 11/2019 Zhang et al.
(Continued)

OTHER PUBLICATIONS

Partial Supplementary European Search Report issued in corresponding European Application No. 22831712.9, dated Sep. 10, 2024, pp. 1-15.
(Continued)

*Primary Examiner* — Vineeta S Panwalkar
(74) *Attorney, Agent, or Firm* — HAUPTMAN HAM, LLP

(57) ABSTRACT

A polar code construction method and an apparatus. A communication apparatus obtains a reliability weight sequence, and determines a first threshold that indicates a weight of lowest reliability of a subchannel corresponding to an information bit. The communication apparatus determines a non-pre-frozen subchannel corresponding to a content value greater than or equal to the first threshold in the reliability weight sequence as the subchannel corresponding to the information bit based on the first threshold, and performs polar coding on the information bit based on the subchannel corresponding to the information bit.

19 Claims, 9 Drawing Sheets

(58) Field of Classification Search
CPC ............... H03M 13/036; H03M 13/09; H03M 13/2906; H03M 13/6306; H03M 13/13; H04W 28/04
See application file for complete search history.

(56) References Cited

U.S. PATENT DOCUMENTS

| | | | |
|---|---|---|---|
| 2020/0092042 A1 | 3/2020 | Huang et al. | |
| 2022/0286144 A1* | 9/2022 | Li | H04L 1/0065 |

OTHER PUBLICATIONS

Partial Supplementary European Search Report issued in corresponding European Application No. 22831712.9, dated Sep. 10, 2024, pp. 1-14.

* cited by examiner

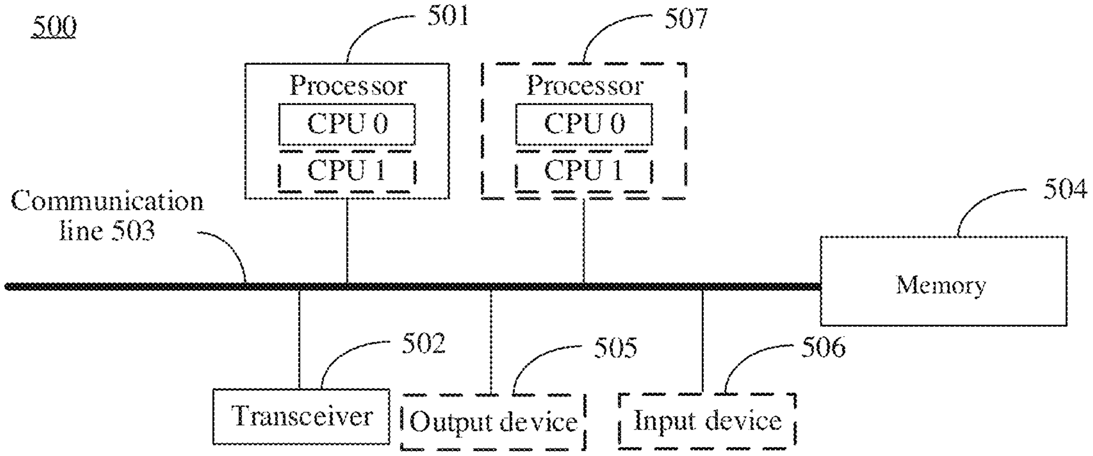

FIG. 5

601 A communication apparatus obtains a reliability weight sequence

602 The communication apparatus determines a first threshold

603 The communication apparatus determines a subchannel corresponding to an information bit based on the first threshold 604 The communication apparatus performs polar coding on the information bit based on the subchannel corresponding to the information bit

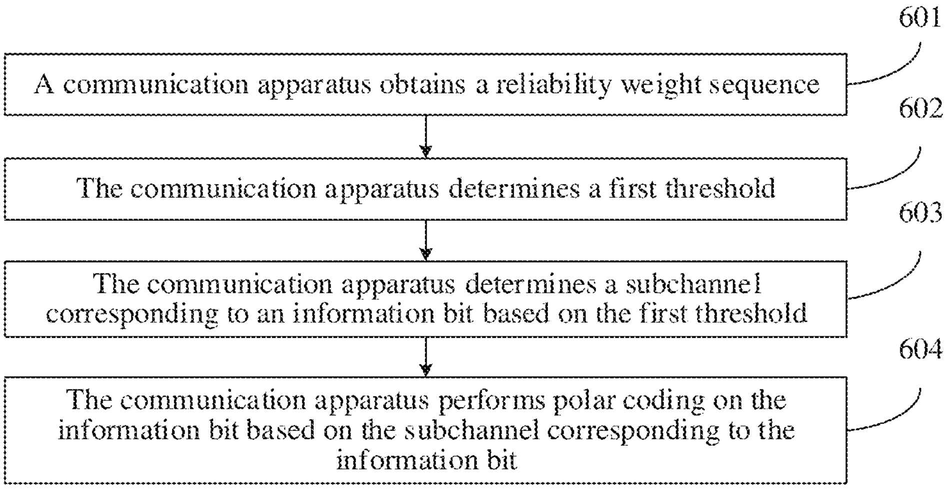

FIG. 6

1101: A communication apparatus determines a mother code length N0 and a pre-frozen sequence P0 in an initial transmission based on a length E0 of a sending sequence and a quantity K of information bits in the initial transmission

↓

1102: The communication apparatus determines a pre-frozen sequence P1 in a retransmission based on a length E1 of a sending sequence in the retransmission, the length E0 of the send sequence in the initial transmission, and the mother code length N0 in the initial transmission, and combines the pre-frozen sequence P1 in the retransmission and the pre-frozen sequence in the initial transmission into P2

↓

1103: The communication apparatus determines a first threshold 1 in the initial transmission based on E0, K, N0, and P0

↓

1104: The communication apparatus determines a first threshold 2 in the retransmission based on E1, K, N1, and P2

↓

1105: The communication apparatus determines a subchannel corresponding to the information bit in the initial transmission based on the first threshold 1, and maps the information bit to a high half area of a mother code length in the retransmission

↓

1106: The communication apparatus determines a subchannel corresponding to an information bit in the retransmission based on the first threshold 2

↓

1107: The communication apparatus sets a copied bit I_copy to 0 in a region in which I = 0 to N−1, and to 1 in a region in which I = N to 2*N−1 is I_map_ir_high_init[i]==1& I_map_ir[i]==0, or to 0 in a remaining region

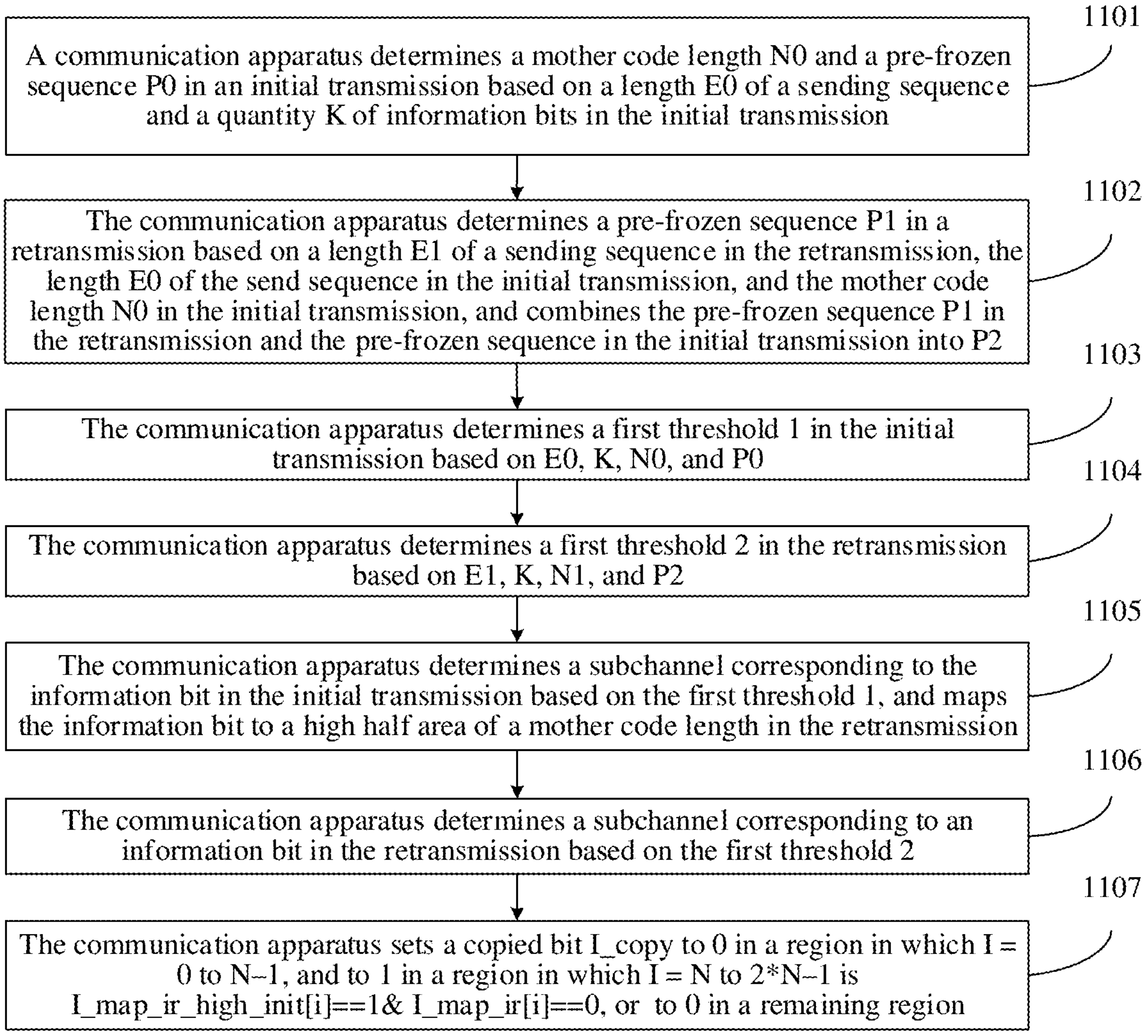

FIG. 11

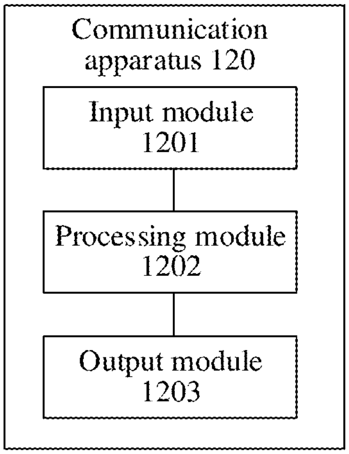

FIG. 12

POLAR CODE CONSTRUCTION METHOD AND APPARATUS

CROSS-REFERENCE TO RELATED APPLICATIONS

This application is a continuation of International Patent Application No. PCT/CN2022/099032, filed on Jun. 15, 2022, which claims priority to Chinese Patent Application No. 202110738492.4, filed on Jun. 30, 2021. The disclosures of the aforementioned applications are hereby incorporated by reference in their entireties.

BACKGROUND

In an existing communication system, a channel-polarization-based constructive coding scheme, that is, a polar code, is proposed. The polar code constructs an information bit and a frozen bit based on a Q sequence, where the Q sequence is a group of data sets, for example, Q[0], Q[1], . . . , and Q[N−1]. An index i of data Q[i] indicates reliability of Q[i]. In the 3GPP NR standard, a larger value of i indicates higher reliability of Q[i], where Q[i] indicates a location of a natural order, and i is a natural number in a range from 0 to N−1.

For example, a communication apparatus selects a mother code length N and a pre-frozen sequence P based on a to-be-transmitted sequence length E and a length K of the information bit, initialize a register sequence I_MAP whose length is N to 0, and initialize a counter to 0. The communication apparatus sequentially reads, from an end of the Q sequence, a value Q[i] in the Q sequence. In response to Q[i] being greater than or equal to N, or Q[i]∈P, the communication apparatus skips. In response to Q[i] being less than N, the communication apparatus sets I_MAP[Q[i]]=1, and increases the counter by 1. In response to the counter being smaller than K, the communication apparatus continues to read a next value in the Q sequence. In response to the counter being equal to K, the communication apparatus jumps out of a loop, and construction ends. In the I_MAP, a location whose value is 1 corresponds to the information bit, and a location other than the location corresponding to the information bit corresponds to the frozen bit.

Because each piece of data in the Q sequence is sorted based on reliability, the pieces of data in the Q sequence are discontinuous, and the data is a real physical location of a bit, a memory record is needed in a construction process, an addressing address is complex, and a delay is great. To reduce the delay, parallel construction is used, to be specific, values are assigned to a plurality of locations at a time. However, in this case, a hardware circuit of a register uses a plurality of addressing circuits, to assign the values to the plurality of locations at a time. As a result, an area of the hardware circuit is large, overheads are large, and costs are high. In addition, in a parallel construction process, a location of the information bit still is to be determined for each parallel sequence in series. This affects the delay and leads to a limited degree of parallelism.

SUMMARY

In view of this, at least one embodiment provides a polar code construction method and an apparatus, to resolve technical problems that an area of a hardware circuit is large, overheads are large, costs are high, impact on a delay is great, and a degree of parallelism is limited in response to parallel polar code construction being performed based on a Q sequence.

According to a first aspect, at least one embodiment provides a polar code construction method. The method includes: A communication apparatus obtains a reliability weight sequence, determines a first threshold that indicates a weight of lowest reliability of a subchannel corresponding to an information bit, determines a non-pre-frozen subchannel corresponding to a content value greater than or equal to the first threshold in the reliability weight sequence as the subchannel corresponding to the information bit based on the first threshold, and performs polar coding on the information bit based on the subchannel corresponding to the information bit.

According to the first aspect, because content values in the reliability weight sequence are sorted based on a natural order, the content values in the reliability weight sequence are continuous, and are real physical locations of bits, a construction process is not recorded in a memory, and values are directly assigned to continuous physical locations by using one addressing circuit. This reduces an area of a hardware circuit, overheads, and costs. In addition, this reduces a delay, and constructs a polar code by effectively using a parallel construction method.

In at least one embodiment, the communication apparatus determines the first threshold from a first correspondence based on a length of a sending sequence and a quantity of information bits, where the first correspondence includes the length of the sending sequence, the quantity of information bits, and the first threshold corresponding to the length of the sending sequence and the quantity of information bits.

Based on at least one embodiment, in response to a quantity of combinations of the length of the sending sequence and the quantity of information bits of the polar code that a communication system is to support being small, for example, is no more than 128 combinations, a value of the first threshold is stored in a form of the first correspondence based on different lengths of the sending sequence and quantities of information bits, so that the first threshold is determined by using the first correspondence in response to the polar code being constructed based on the reliability weight sequence.

In at least one embodiment, the communication apparatus sets M to be equal to 0. In response to M being less than the quantity K of information bits, the communication apparatus performs the following cyclic operation: The communication apparatus reads X content values, compares the X content values with a pre-frozen sequence, and determines a quantity m of subchannels corresponding to information bits corresponding to the X content values, where the X content values are a first group of X content values in a reliability ranking sequence. The communication apparatus counts m into M to obtain M', where M'=M+m. In response to M' being less than K, the communication apparatus sets M to be equal to M', and updates the X content values, where updated X content values are a next group of X content values in the reliability ranking sequence. In response to M' being greater than or equal to K, the communication apparatus determines a sequence number of a $Y^{th}$ content value in descending order of sequence numbers in the X content values as the first threshold, and terminates the cyclic operation, where Y=K−(M'−m).

In at least one embodiment, the communication apparatus determines a quantity of content values that are in the X content values and that are different from content values in the pre-frozen sequence as m.

Based on the foregoing two embodiments, in response to the quantity of combinations of the length of the sending sequence and the quantity of information bits of the polar code that the communication system is to support being large, compared with determining the first threshold based on the first correspondence, determining the first threshold based on the reliability ranking sequence avoids that in response to the quantity of combinations of the length of the sending sequence and the quantity of information bits being uncontrollable, excessive overheads of a Z sequence are caused by excessively numerous offline computing first thresholds. This reduces storage overheads and reduces costs.

In at least one embodiment, the quantity of information bits includes at least one of the following: a cyclic redundancy check bit and a parity check bit.

Based on at least one embodiment, in response to the subchannel corresponding to the information bit being a subchannel corresponding to the parity check bit or a subchannel corresponding to the cyclic redundancy check bit, the subchannel is changed from the subchannel corresponding to the information bit to a subchannel corresponding to a frozen bit. This improves accuracy of the subchannel corresponding to the information bit determined by the communication apparatus.

In at least one embodiment, the communication apparatus determines a first threshold corresponding to a retransmission process; determines the subchannel corresponding to the information bit corresponding to the retransmission process based on the first threshold corresponding to the retransmission process, where the subchannel corresponding to the information bit corresponding to the retransmission process is a non-pre-frozen subchannel corresponding to a content value greater than or equal to the first threshold corresponding to the retransmission process in the reliability weight sequence; and performs polar coding on the information bit corresponding to the retransmission process based on the subchannel corresponding to the information bit corresponding to the retransmission process.

Based on at least one embodiment, the polar code construction method provided in at least one embodiment is also applied to the retransmission process, to construct the information bit and a copied bit. This reduces the delay, and constructs the polar code by effectively using the parallel construction method.

According to a second aspect, at least one embodiment provides a communication apparatus. The communication apparatus implements functions performed by the communication apparatus according to the first aspect. The functions are implemented by hardware executing corresponding software. The hardware or the software includes one or more modules corresponding to the functions, for example, an input module and a processing module. The input module is configured to obtain a reliability weight sequence. The processing module is configured to determine a first threshold that indicates a weight of lowest reliability of a subchannel corresponding to an information bit. The processing module is further configured to determine a non-pre-frozen subchannel corresponding to a content value greater than or equal to the first threshold in the reliability weight sequence as a subchannel corresponding to the information bit based on the first threshold. The processing module is further configured to perform polar coding on the information bit based on the subchannel corresponding to the information bit.

In at least one embodiment, the processing module is specifically configured to determine the first threshold from a first correspondence based on a length of a sending sequence and a quantity of information bits, where the first correspondence includes the length of the sending sequence, the quantity of information bits, and the first threshold corresponding to the length of the sending sequence and the quantity of information bits.

In at least one embodiment, the processing module is further configured to set M to be equal to 0. In response to M being less than the quantity K of information bits, the processing module performs the following cyclic operation: The processing module reads X content values, compares the X content values with a pre-frozen sequence, and determines a quantity m of subchannels corresponding to information bits corresponding to the X content values, where the X content values are a first group of X content values in a reliability ranking sequence. The processing module counts m into M to obtain M', where M'=M+m. In response to M' being less than K, the processing module sets M to be equal to M', and updates the X content values, where updated X content values are a next group of X content values in the reliability ranking sequence. In response to M' being greater than or equal to K, the processing module determines a sequence number of a $Y^{th}$ content value in descending order of sequence numbers in the X content values as the first threshold, and terminates the cyclic operation, where Y=K−(M'−m).

In at least one embodiment, the processing module is specifically configured to determine a quantity of content values that are in the X content values and that are different from content values in the pre-frozen sequence as m.

In at least one embodiment, the quantity of information bits includes at least one of the following: a cyclic redundancy check bit and a parity check bit.

In at least one embodiment, the processing module is further configured to determine a first threshold corresponding to a retransmission process; determine the subchannel corresponding to the information bit corresponding to the retransmission process based on the first threshold corresponding to the retransmission process, where the subchannel corresponding to the information bit corresponding to the retransmission process is a non-pre-frozen subchannel corresponding to a content value greater than or equal to the first threshold corresponding to the retransmission process in the reliability weight sequence; and perform polar coding on the information bit corresponding to the retransmission process based on the subchannel corresponding to the information bit corresponding to the retransmission process.

For a specific implementation of the communication apparatus, further refer to behavior functions of the communication apparatus in the polar code construction method provided in the first aspect. For technical effects brought by the communication apparatus, also refer to technical effects brought by any one of at least one embodiment. Details are not described.

According to a third aspect, at least one embodiment provides a communication apparatus. The communication apparatus is a communication apparatus, a chip in the communication apparatus, or a system-on-a-chip. The communication apparatus implements functions performed by the communication apparatus in the foregoing aspects. The functions is implemented by hardware. In at least one embodiment, the communication apparatus includes a transceiver and a processor. The transceiver and the processor are configured to support the communication apparatus in implementing functions in the first aspect. For example, the transceiver is configured to obtain a reliability weight sequence. The processor is configured to determine a first threshold that indicates a weight of lowest reliability of a subchannel corresponding to an information bit. The processor is further configured to determine a non-pre-frozen subchannel corresponding to a content value greater than or equal to the first threshold in the reliability weight sequence as a subchannel corresponding to the information bit based on the first threshold. The processor is further configured to perform polar coding on the information bit based on the subchannel corresponding to the information bit. In at least one embodiment, the communication apparatus further includes a memory. The memory is configured to store computer-executable instructions and data that are used by the communication apparatus. In response to the communication apparatus running, the transceiver and the processor execute the computer-executable instructions stored in the memory, to enable the communication apparatus to perform the polar code construction method according to the first aspect.

For a specific implementation of the communication apparatus in the third aspect, refer to behavior functions of the communication apparatus in the polar code construction method provided in at least one embodiment.

According to a fourth aspect, a communication apparatus is provided. The communication apparatus includes one or more processors, where the one or more processors are configured to run a computer program or instructions. In response to the one or more processors executing the computer program or the instructions, the communication apparatus is enabled to perform the polar code construction method according to the first aspect.

In at least one embodiment, the communication apparatus further includes one or more communication interfaces. The one or more communication interfaces are coupled to the one or more processors. The one or more communication interfaces are configured to communicate with another module other than the communication apparatus.

In at least one embodiment, the communication apparatus further includes one or more memories. The one or more memories are coupled to the one or more processors. The one or more memories are configured to store the computer program or the instructions. In at least one embodiment, the memory is located outside the communication apparatus. In at least one embodiment, the memory is located inside the communication apparatus. In at least one embodiment, the processor and the memory is alternatively integrated into one component. In other words, the processor and the memory is alternatively integrated together.

According to a fifth aspect, a communication apparatus is provided. The communication apparatus includes an interface circuit and a logic circuit. The interface circuit is coupled with the logic circuit. The logic circuit is configured to perform the polar code construction method according to the first aspect. The interface circuit is configured to communicate with another module other than the communication apparatus.

According to a sixth aspect, a computer-readable storage medium is provided. The computer-readable storage medium stores computer instructions or a program. In response to the computer instructions or the program being run on a computer, the computer is enabled to perform the polar code construction method according to the first aspect.

According to a seventh aspect, a computer program product including computer instructions is provided. In response to the computer program product running on a computer, the computer is enabled to perform the polar code construction method according to the first aspect.

According to an eighth aspect, at least one embodiment provides a computer program. In response to the computer program being run on a computer, the computer is enabled to perform the polar code construction method according to the first aspect.

For technical effects brought by the fourth aspect to the eighth aspect, refer to technical effects brought by the first aspect. Details are not described.

BRIEF DESCRIPTION OF DRAWINGS

FIG. 5 is a schematic diagram of a structure of a communication apparatus according to at least one embodiment;

FIG. 6 is a flowchart of a polar code construction method according to at least one embodiment;

FIG. 11 is a flowchart of a method for constructing an information bit and a copied bit according to at least one embodiment; and FIG. 12 is a schematic diagram of composition of a communication apparatus according to at least one embodiment.

DESCRIPTION OF EMBODIMENTS

Figure 1:
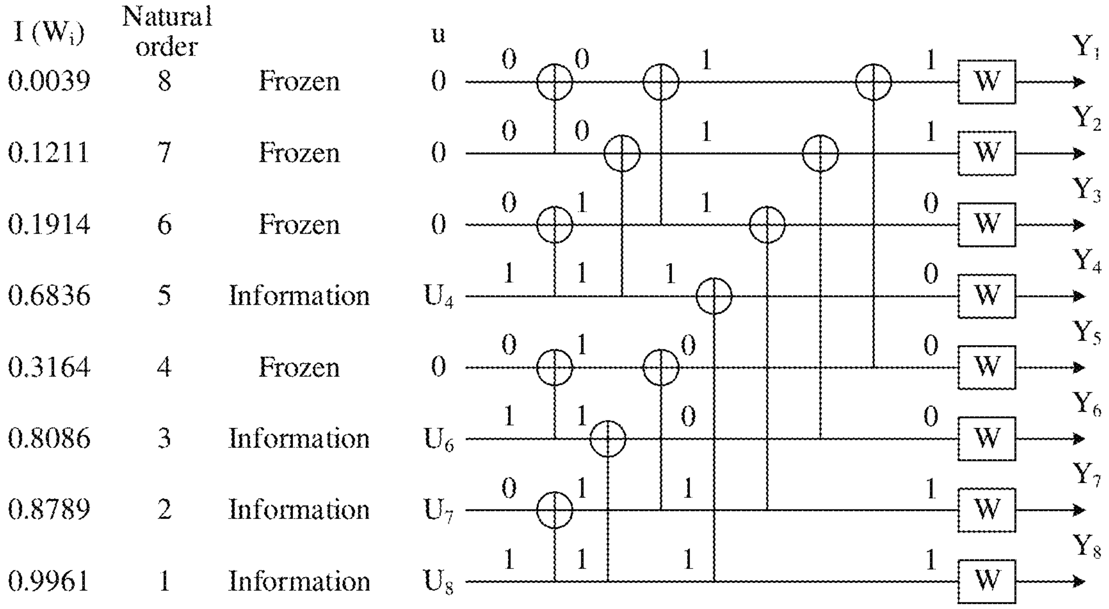
FIG. 1 is a schematic diagram of polar code construction according to at least one embodiment.

Before embodiments are described, technical terms used in embodiments are described.

Polar code: a linear code block, where the polar code is designed based on channel-polarization, is a constructive coding scheme that is proved by using a strict mathematical method to achieve a channel capacity, and is also referred to as a polar code.

A generator matrix of the polar code is $G_N$, and the generator matrix is also described as a coding matrix. A polar code coding process is $$x_1^N = u_1^N G_N,\ \text{where } x_1^N$$

is a polar code whose code length is N.

$$u_1^N = (u_1, u_2, \ldots, u_N)$$

is a binary row vector with a length of N. $G_N$ is an N×N matrix, and $$G_N = F_2^{\otimes(\log_2(N))},\ \text{where } F_2^{\otimes(\log_2(N))}$$

is defined as a Kronecker product of $\log_2(N)$ matrices $F_2$, $$\text{where } F_2 = \begin{bmatrix} 1 & 0 \\ 1 & 1 \end{bmatrix};$$

$$F_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}; \text{and}$$

$$F_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

In the polar code coding process, a part of bits of $$u_1^N$$

is used for carrying information, a bit that carries information is referred to as an information bit, and these information bits form an information bit set. A set of indexes of the information bits is denoted as A. The other part of bits of $$u_1^N$$

is set to fixed values agreed on in advance by a receiving end and a transmitting end, and are referred to as fixed bits or frozen bits. A set of indexes of the frozen bits is indicated by a complementary set $A^c$ of A, where the frozen bits is set to 0, or is set to any fixed value agreed on in advance by the receiving end and the transmitting end. This is not limited.

Based on the information bits and the frozen bits, the polar code coding process is equivalent to:

$$x_1^N = u_A G_N(A) \oplus u_{A^c} G_N(A^c),$$

where $u_A$ is the information bit set in $$u_1^N,$$

a quantity is K, in other words, $u_A$ is a row vector of a length K, |A|=K, |·| indicates a quantity of elements in the set, and K is a quantity of information bits, K is described as a size of an information block, or K is described as a size of the information bit set; in $G_N$, $G_N(A)$ is a submatrix obtained from those rows corresponding to the indexes in the set A, and $G_N(A)$ is a K×N matrix; $u_{A^c}$ is a frozen bit set in $$u_1^N,$$

a quantity of frozen bits is (N−K), and the frozen bits are known bits; in $G_N$, $G_N(A^c)$ is a submatrix obtained from those rows corresponding to the indexes in the set $A^c$. In response to the frozen bits being set to 0, the polar code coding process is simplified as:

$$x_1^N = u_A G_N(A),$$

in other words, a polar code construction process is actually a selection process of the set A, and accuracy of the selection process determines performance of the polar code.

For example, as shown in FIG. 1, a matrix in which a row vector u is (0, 0, 0, U4, 0, U6, U7, U8) and a generator matrix is an 8×8 matrix is used as an example. After the generator matrix is used for the row vector u, coded bits is a vector (Y1, Y2, Y3, Y4, Y5, Y6, Y7, Y8). A communication apparatus maps a bit corresponding to a polar channel with high reliability to an information bit, and map a bit corresponding to a polar channel with low reliability to a frozen bit. As shown in FIG. 1, in bits of the row vector u, {u1, u2, u3, u5} is determined as locations of frozen bits, {u4, u6, u7, u8} is determined as locations of information bits, and a to-be-coded information vector whose length is 4 is mapped to the locations of the information bits.

The communication apparatus determines reliability of each polar channel based on a reliability ranking sequence, and determine the locations of the information bits based on the reliability, to complete a polar code construction process.

Specifically, the reliability ranking sequence is a group of data sets. An index of the reliability ranking sequence indicates reliability. A larger index indicates higher reliability. Data in the reliability ranking sequence is also described as a content value, and the content value in the reliability ranking sequence indicates a location of a natural order. The reliability ranking sequence is also described as a Q sequence.

For example, an example in which the Q sequence includes Q[0], Q[1], . . . , and Q[N−1] is used. An index i of a content value Q[i] indicates reliability of Q[i]. A larger value of i indicates higher reliability of Q[i]. Q[i] indicates the location of the natural order, and i is a natural number in a range from 0 to N−1.

Figure 2:
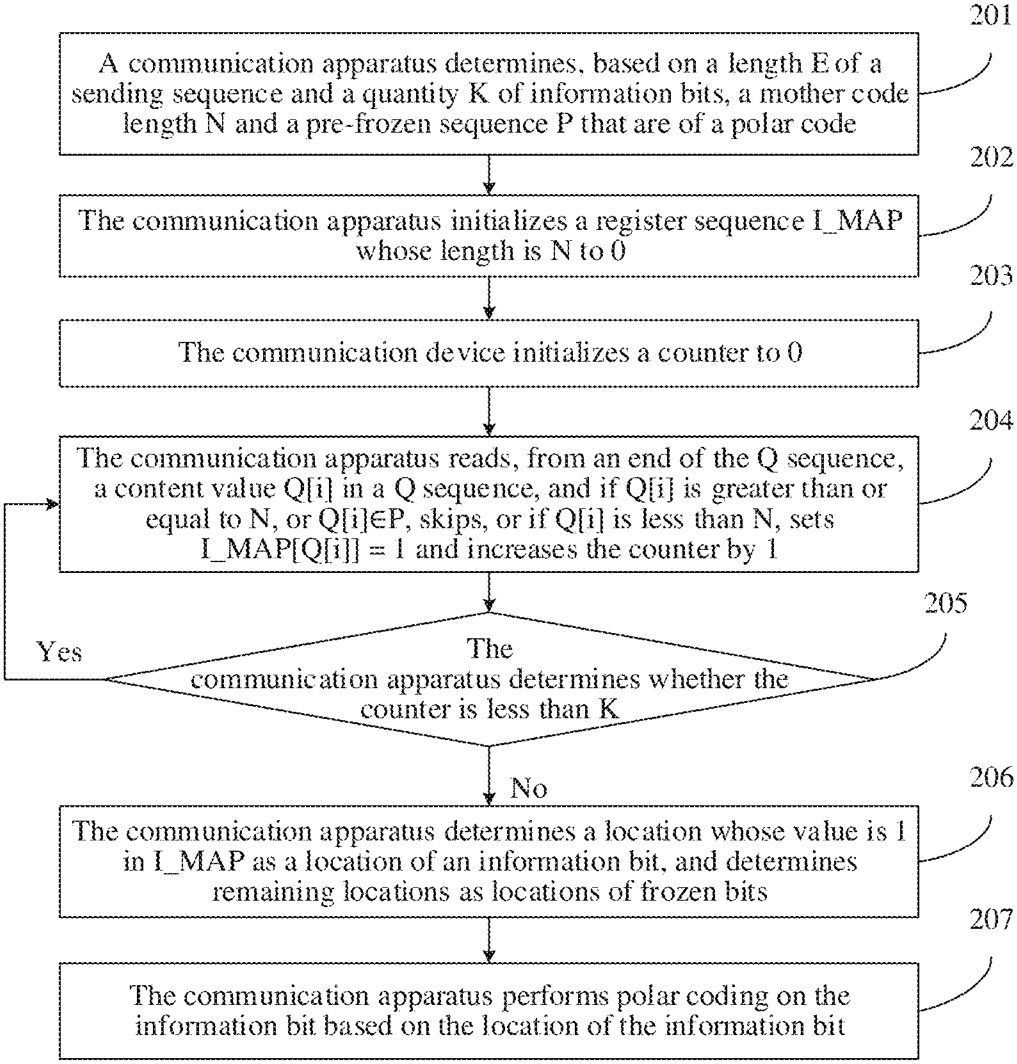
FIG. 2 is a flowchart of a polar code construction method according to at least one embodiment.

For example, as shown in FIG. 2, a communication apparatus determines a location of an information bit and a location of a frozen bit based on a Q sequence according to the following method shown in FIG. 2, and perform polar coding on the information bit based on the location of the information bit to construct a polar code. The method includes the following steps.

Step 201: The communication apparatus determines a mother code length N and a pre-frozen sequence P that are of the polar code based on a length E of a sending sequence and a quantity K of information bits.

The communication apparatus determines, based on the length E of the sending sequence and the quantity K of information bits, the mother code length N and the pre-frozen sequence P based on related descriptions of the mother code length and the pre-frozen sequence that are of the polar code in a communication protocol.

The mother code length N is an integer power of 2.

For example, the mother code length N is 2^(ceil(log 2(E))), or is 2^(ceil(log 2(E))−1). This is not limited. The ceil function indicates rounding up.

The pre-frozen sequence P includes one or more of the following sequences: a puncturing sequence, a shortened sequence, a sequence that is to be correspondingly frozen based on the puncturing sequence or the shortened sequence, a sequence that has both capabilities of puncturing and shortening, some other sequences that is to be pre-frozen, and the like. The puncturing sequence is also described as a rate matching channel puncturing location set, a rate puncturing sequence, or the like. This is not limited.

Step 202: The communication apparatus initializes a register sequence I_MAP whose length is N to 0.

Step 203: The communication apparatus initializes a counter to 0.

Step 204: The communication apparatus reads, from an end of the Q sequence, a content value Q[i] in the Q sequence, and in response to Q[i] is greater than or equal to N, or $Q[i] \in P$, skips; or in response to Q[i] is less than N, sets I_MAP[Q[i]]=1, and increases the counter by 1.

Step 205: The communication apparatus determines whether the counter is less than K; and in response to the counter is less than K, step 204 is performed again; or in response to the counter is greater than or equal to K, step 206 is performed.

Step 206: The communication apparatus determines a location whose value is 1 in I_MAP as the location of the information bit, and determines remaining locations as locations of frozen bits.

Step 207: The communication apparatus performs polar coding on the information bit based on the location of the information bit.

According to the method shown in FIG. 2, the communication apparatus determines, based on the mother code length N, that there are N polar channels in total, and the N polar channels is respectively corresponding to N rows of a generator matrix. The communication apparatus uses, based on the Q sequence, indexes corresponding to first K non-pre-frozen polar channels with high reliability as elements of a set A of indexes of the information bits, and indexes corresponding to remaining (N−K) polar channels as elements of a set $A^c$ of indexes of the frozen bits. Locations of the information bits are determined based on the set A, and locations of the frozen bits are determined based on the set $A^c$.

Figure 3:
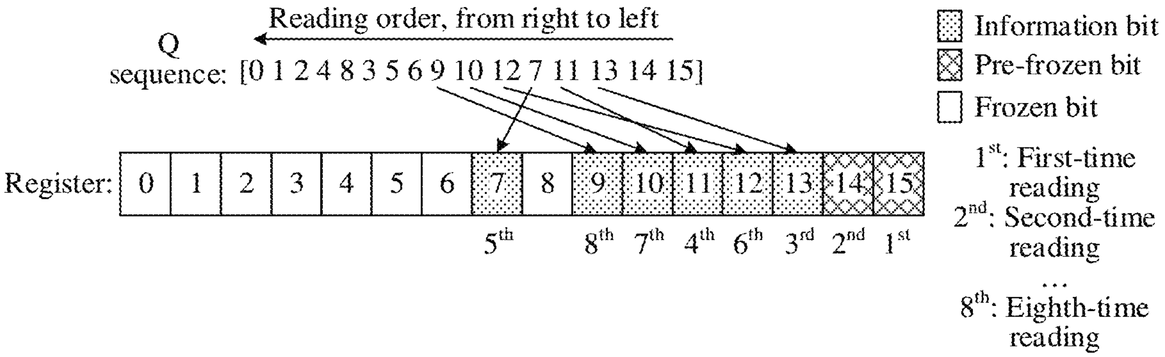
FIG. 3 is a schematic diagram of polar code construction according to at least one embodiment.

For example, as shown in FIG. 3, an example in which a Q sequence is [0, 1, 2, 4, 8, 3, 5, 6, 9, 10, 12, 7, 11, 13, 14, 15] and a quantity of information bits is 6 is used. Assuming that a communication apparatus determines, based on a length of a sending sequence and the quantity of information bits, that the pre-frozen sequence is [14, 15], to implement rate matching, the communication apparatus sequentially reads, from an end of the Q sequence, a content value in the Q sequence based on the foregoing steps shown in FIG. 2. In response to the content value is greater than or equal to 16, or the content value belongs to the pre-frozen sequence [14, 15], the communication apparatus skips. In response to the content value neither is greater than or equal to 16 nor belongs to the pre-frozen sequence [14, 15], the communication apparatus sets a register to be equal to 1, increases a counter by 1 until the counter is equal to 6, and jumps out of a loop. In response to the counter is not equal to 6, the communication apparatus reads the content value in the Q sequence again until the counter is equal to 6, to obtain information bits and frozen bits including pre-frozen bits in FIG. 3.

In response to a polar code is constructed based on the Q sequence, because content values in the Q sequence are sorted based on reliability, the content values in the Q sequence are discontinuous, and are real physical locations of bits, a memory record is needed in a construction process, an addressing address is complex, and a delay is great. To reduce the delay, parallel construction is used, to be specific, values are assigned to a plurality of locations at a time. However, because the content values in the Q sequence are discontinuous, a hardware circuit of the register uses a plurality of addressing circuits, to assign the values to the plurality of locations at a time. For example, in response to values being assigned to 64 locations of Q[i] at a time, the hardware circuit of the register is to have 64 addressing circuits. As a result, an area of the hardware circuit is large, overheads are large, and costs are high. In addition, in a parallel construction process, a location of an information bit still is to be determined for each parallel sequence in series. This affects the delay and leads to a limited degree of parallelism.

In addition, in response to a maximum length of the polar code being 1 K, a contradiction between costs and efficiency is not extremely sharp in a manner of constructing the polar code by using the Q sequence. However, once the polar code enters a data channel, in response to a length of the polar code reaching 4 K, 8 K, or even 16 K, a size of a constructor for constructing the polar code is approximately the same as a size of a downlink decoder of new radio (NR), and a contradiction in costs is prominent.

To resolve the foregoing problem, at least one embodiment provide a polar code construction method and an apparatus. A communication apparatus obtains a reliability weight sequence, determine a first threshold that indicates a weight of lowest reliability of a subchannel corresponding to an information bit, determine a non-pre-frozen subchannel corresponding to a content value greater than or equal to the first threshold in the reliability weight sequence as the subchannel corresponding to the information bit based on the first threshold, and perform polar coding on the information bit based on the subchannel corresponding to the information bit.

In at least one embodiment, because content values in the reliability weight sequence are sorted based on a natural order, the content values in the reliability weight sequence are continuous, and are real physical locations of bits, a construction process is not recorded in a memory, and values is directly assigned to continuous physical locations by using one addressing circuit. This reduces an area of a hardware circuit, overheads, and costs. In addition, this reduces a delay, and constructs a polar code by effectively using a parallel construction method.

The following describes implementations of at least one embodiment in detail with reference to the accompanying drawings.

A polar code construction method provided in at least one embodiment is applied to any communication system. The communication system is a third generation partnership project (3GPP) communication system, for example, a long term evolution (LTE) system, is a fifth generation (5G) mobile communication system, an NR system, an NR vehicle to everything (V2X) system, or various types of next generation communication systems, for example, a sixth generation (6G) mobile communication system, or is a satellite communication system, a non-3GPP communication system, or the like. This is not limited.

The polar code construction method provided in at least one embodiment is applied to various communication scenarios, and is particularly applicable to a channel coding scenario in which a polar code serves as a long code-length in the communication system, for example, is applied to one or more of the following communication scenarios: coding of a vehicle-to-everything control channel, coding of a vehicle-to-everything data channel, coding of a 5G NR control channel, coding of a 5G NR data channel, and the like.

Figure 4:
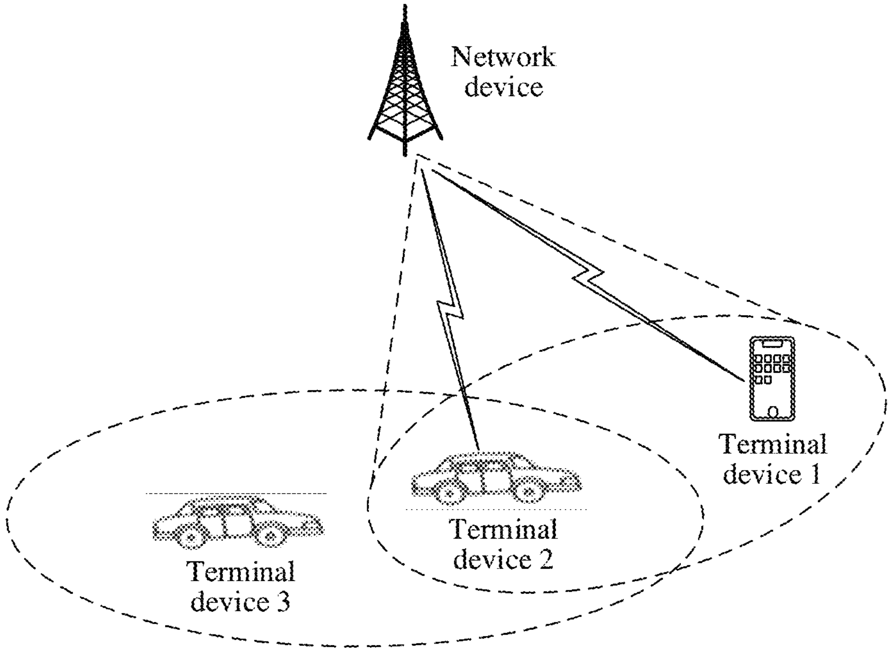
FIG. 4 is a schematic diagram of a communication system according to at least one embodiment.

The following uses FIG. 4 as an example to describe a communication system provided in at least one embodiment.

FIG. 4 is a schematic diagram of a communication system according to at least one embodiment. As shown in FIG. 4, the communication system includes at least one terminal device and at least one network device.

In FIG. 4, the terminal device is located within a beam/cell coverage of the network device, and the network device provides a communication service for the terminal device. For example, the network device codes downlink data by using channel coding, and send the downlink data to the terminal device through an air interface after constellation modulation. Alternatively, the terminal device codes the uplink data by using channel coding, and send the uplink data to the network device through the air interface after the constellation modulation.

The terminal device in FIG. 4 is a terminal device supporting new radio, and accesses the communication system through the air interface, and initiate a call service, an internet access service, or another service. The terminal device is also referred to as user equipment (UE), a mobile station (MS), a mobile terminal (MT), or the like. Specifically, the terminal device in FIG. 4 is a mobile phone, a smartwatch, a tablet computer, or a computer having a wireless transceiver function. Alternatively, the terminal device in FIG. 4 is a virtual reality (VR) terminal, an augmented reality (AR) terminal, a wireless terminal in industrial control, a wireless terminal in self-driving, a wireless terminal in telemedicine, a wireless terminal in a smart grid, a wireless terminal in a smart city, a wireless terminal in a smart home, an in-vehicle terminal, a vehicle having a vehicle-to-vehicle (V2V) communication capability, an intelligent connected vehicle, an uncrewed aerial vehicle having an uncrewed aerial vehicle-to-uncrewed aerial vehicle communication capability, or the like. This is not limited.

The network device in FIG. 4 is any device having a wireless transceiver function, and is mainly configured to implement functions, for example, a wireless physical control function, resource scheduling, radio resource management, and radio access control and mobility management, and provide a reliable wireless transmission protocol, a data encryption protocol, and the like. Specifically, the network device is a device supporting wired access, or is a device supporting wireless access. For example, the network device is an access network (AN)/a radio access network (RAN) device, and includes a plurality of 5G-AN/5G-RAN nodes. The 5G-AN/5G-RAN node is an access point (AP), a NodeB (NB), an enhanced NodeB (eNB), a next-generation NodeB (gNB), a transmission reception point (TRP), a transmission point (TP), a satellite, another access node, or the like.

During specific implementation, as shown in FIG. 4, terminal devices and network devices each uses a composition structure shown in FIG. 5, or include components shown in FIG. 5. FIG. 5 is a schematic diagram of composition of a communication apparatus 500 according to at least one embodiment. The communication apparatus 500 is a terminal device, or a chip or a system-on-a-chip in the terminal device, or is a network device, or a chip or a system-on-a-chip in the network device. As shown in FIG. 5, the communication apparatus 500 includes a processor 501, a transceiver 502, and a communication line 503.

Further, the communication apparatus 500 alternatively includes a memory 504. The processor 501, the memory 504, and the transceiver 502 is connected by using the communication line 503.

The processor 501 is a central processing unit (CPU), a general-purpose processor, a network processor (NP), a digital signal processor (DSP), a microprocessor, a microcontroller, a programmable logic device (PLD), or any combination thereof. The processor 501 is alternatively another apparatus having a processing function, for example, a circuit, a device, or a software module. This is not limited.

The transceiver 502 is configured to communicate with another device or another communication network. The another communication network is an Ethernet, a RAN, a wireless local region network (WLAN), or the like. The transceiver 502 is a module, a circuit, a transceiver, or any apparatus that implements communication.

The communication line 503 is configured to transfer information between components included in the communication apparatus 500.

The memory 504 is configured to store instructions. The instructions is a computer program.

The memory 504 is a read-only memory (ROM) or another type of static storage device that stores static information and/or instructions, is a random access memory (RAM) or another type of dynamic storage device that stores information and/or instructions, or is an electrically erasable programmable read-only memory (EEPROM), a compact disc read-only memory (CD-ROM) or another compact disc storage, an optical disc storage (including a compressed optical disc, a laser disc, an optical disc, a digital versatile disc, a Blu-ray disc, and the like), a magnetic disk storage medium or another magnetic storage device, or the like. This is not limited.

The memory 504 is independent of the processor 501, or is integrated together with the processor 501. The memory 504 is configured to store instructions, program code, some data, or the like. The memory 504 is located inside the communication apparatus 500, or is located outside the communication apparatus 500. This is not limited. The processor 501 is configured to execute the instructions stored in the memory 504, to implement the polar code construction method provided in the following embodiment described herein.

In an example, the processor 501 includes one or more CPUs, for example, a CPU 0 and a CPU 1 in FIG. 5.

In an optional implementation, the communication apparatus 500 includes a plurality of processors. For example, in addition to the processor 501 in FIG. 5, the communication apparatus 500 further includes a processor 507.

In an optional implementation, the communication apparatus 500 further includes an output device 505 and an input device 506. For example, the input device 506 is a device, for example, a keyboard, a mouse, a microphone, or a joystick, and the output device 505 is a device, for example, a display screen or a speaker.

The communication apparatus 500 is a desktop computer, a portable computer, a network server, a mobile phone, a tablet computer, a wireless terminal, an embedded device, a chip system, or a device having a structure similar to the structure in FIG. 5. In addition, the composition structure shown in FIG. 5 does not constitute a limitation on the communication apparatus. In addition to the components shown in FIG. 5, the communication apparatus includes more or fewer components than the components shown in the figure, or combines some components, or has a different component arrangement.

In at least one embodiment, the chip system includes a chip, or includes a chip and another discrete component.

In addition, for actions, terms, and the like in at least one embodiment, all refer to each other. This is not limited. In at least one embodiment, names of messages exchanged between devices, names of parameters in messages, or the like are merely examples. During specific implementation, another name is alternatively used. This is not limited.

With reference to the communication system shown in FIG. 4, the following describes the polar code construction method provided in at least one embodiment with reference to FIG. 6. A communication apparatus is any terminal device or network device in the communication system shown in FIG. 4. The communication apparatus described in the following embodiment has the components shown in FIG. 5.

FIG. 6 is a flowchart of a polar code construction method according to at least one embodiment. As shown in FIG. 6, the method includes the following steps.

Step 601: The communication apparatus obtains a reliability weight sequence.

The reliability weight sequence is a group of data sets. A content value in the reliability weight sequence indicates reliability. A larger content value indicates higher reliability. The content value in the reliability weight sequence is a weight of the reliability. An index of the reliability weight sequence indicates a location of a natural order. The index is also described as a sequence number, and the reliability weight sequence is also described as a Z sequence.

For example, the Z sequence is an inverse function of a Q sequence.

For example, an example in which a sequence number of the Q sequence is i, and a content value is Q[i] is used. A sequence number of the Z sequence is Q[i], and a content value is Z[Q[i]]=i, where i is a natural number in a range from 0 to N−1.

Step 602: The communication apparatus determines a first threshold.

The first threshold indicates a weight of lowest reliability of a subchannel corresponding to an information bit. The subchannel is also described as a channel, a polar channel, a location, or the like. This is not limited.

For example, the communication apparatus determines the first threshold from a first correspondence according to the following method 1 and based on a length of a sending sequence and a quantity of information bits, or determines the first threshold according to the following method 2 and based on the Q sequence. Details are not described herein.

The first correspondence includes the length of the sending sequence and the quantity of information bits, and the first threshold corresponding to the length of the sending sequence and the quantity of information bits.

An order of performing step 601 and step 602 is not limited. The communication apparatus first performs step 601 and then perform step 602, first performs step 602 and then perform step 601, or simultaneously performs step 601 and step 602. This is not limited.

Step 603: The communication apparatus determines the subchannel corresponding to the information bit based on the first threshold.

The subchannel corresponding to the information bit is a non-pre-frozen subchannel corresponding to a content value greater than or equal to the first threshold in the reliability weight sequence.

For example, the communication apparatus determines a mother code length and a pre-frozen sequence based on the length of the sending sequence and the quantity of information bits, and read a content value in the Z sequence and a sequence number corresponding to the content value. The communication apparatus separately compares each sequence number of the Z sequence with the pre-frozen sequence and the mother code length. In response to the sequence number belonging to the pre-frozen sequence or the sequence number is greater than the mother code length, a subchannel corresponding to the sequence number is considered a pre-frozen subchannel. In response to the sequence number neither belonging to the pre-frozen sequence nor is greater than the mother code length, a subchannel corresponding to the sequence number is considered a non-pre-frozen subchannel. The communication apparatus further compares each content value in the Z sequence with the first threshold. In response to the content value being greater than or equal to the first threshold, a subchannel corresponding to the content value is pre-selected as the subchannel corresponding to the information bit. The communication apparatus determines a non-pre-frozen subchannel in the pre-selected subchannel corresponding to the information bit as the subchannel corresponding to the information bit, and determine a subchannel other than the subchannel corresponding to the information bit as a subchannel corresponding to a frozen bit.

For descriptions that the communication apparatus determines the mother code length and the pre-frozen sequence based on the length of the sending sequence and the quantity of information bits, refer to related descriptions of step 201. Details are not described.

The communication apparatus first separately compares each sequence number of the Z sequence with the pre-frozen sequence and the mother code length, and then separately compare each content value in the Z sequence with the first threshold, first separately compares each content value in the Z sequence with the first threshold first, and then separately compare each sequence number of the Z sequence with the pre-frozen sequence and the mother code length, or separately compares each content value in the Z sequence with the first threshold, and at the same time, separately compare each sequence number of the Z sequence with the pre-frozen sequence and the mother code length. This is not limited.

Optionally, in response to reading the content value in the Z sequence and the sequence number corresponding to the content value, the communication apparatus reads X content values in the Z sequence and sequence numbers corresponding to the X content values each time based on a readout degree of parallelism X of the Z sequence.

X is less than or equal to the mother code length. In response to X being equal to the mother code length, the communication apparatus reads each content value in the Z sequence and the sequence number corresponding to the content value at a time, and perform comparison. In response to X being less than the mother code length, the communication apparatus reads the X content values in the Z sequence and the sequence numbers corresponding to the X content values each time and read for a plurality of times until a quantity of read content values in the Z sequence is equal to the mother code length.

Optionally, X is an integer power of 2.

Figure 7:
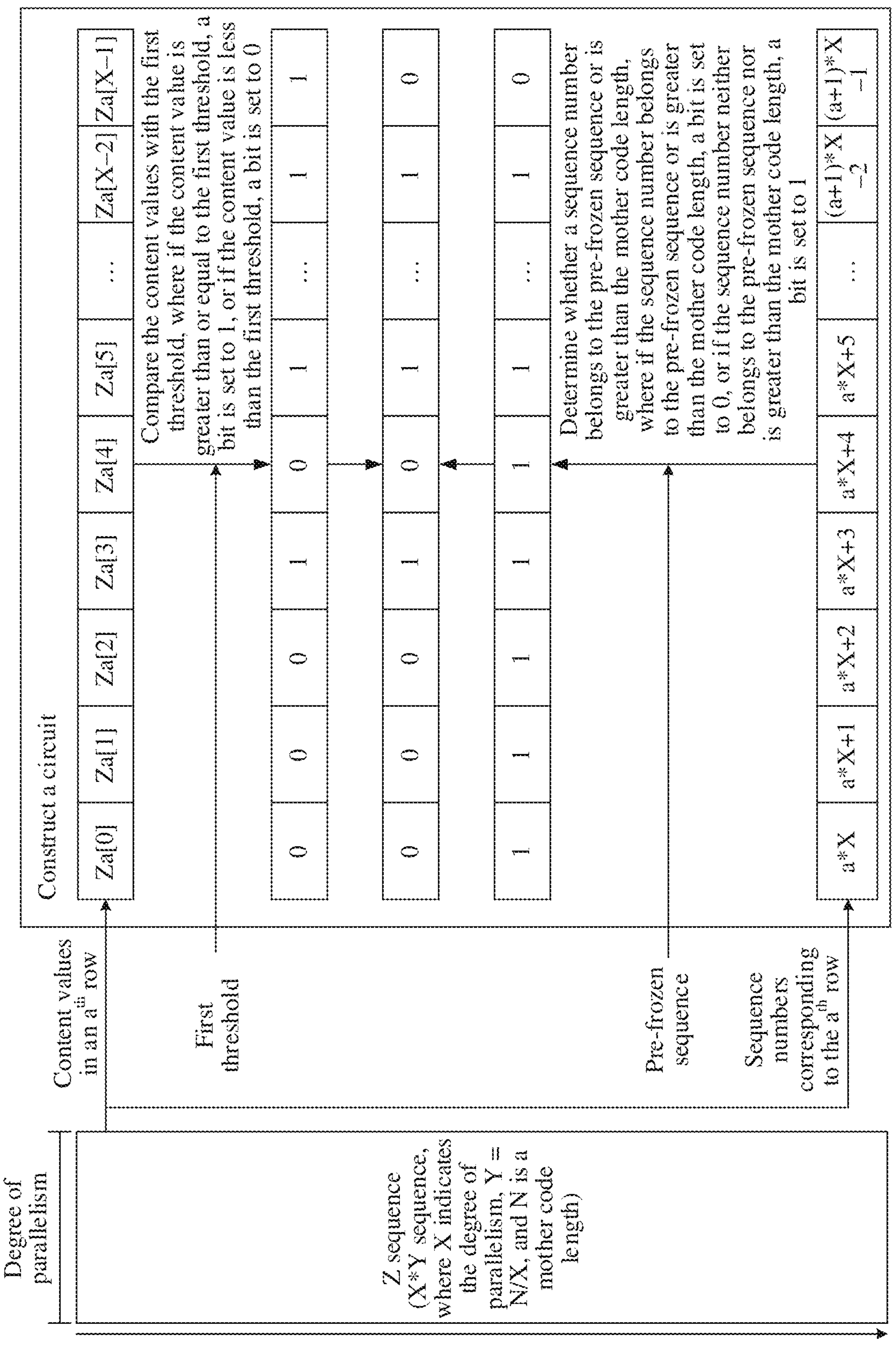
FIG. 7 is a schematic diagram of polar code construction according to at least one embodiment.

For example, as shown in FIG. 7, an example in which the mother code length is N, and the readout degree of parallelism X of the Z sequence is less than the mother code length N is used. The Z sequence is described as an X*Y sequence. The communication apparatus respectively reads X content values in N/X groups and sequence numbers corresponding to the X content values, and perform the following processing on X content values in an $a^{th}$ group and sequence numbers corresponding to the X content values, where $1 \le a \le N/X$: separately comparing the X content values Za[0], Za[1], . . . , and Za[X−1] in the $a^{th}$ group with the first threshold, and pre-selecting a subchannel corresponding to a content value greater than or equal to the first threshold as the subchannel corresponding to the information bit, where for example, a bit is set to 1, to indicate that a subchannel corresponding to the bit is pre-selected as the subchannel corresponding to the information bit, or a bit is set to 0, to indicate that a subchannel corresponding to the bit is not pre-selected as the subchannel corresponding to the information bit; separately comparing the sequence numbers a*X, a*X+1, a*X+2, . . . , and (a+1)*X−1 that are corresponding to the X content values in the $a^{th}$ group with the pre-frozen sequence and the mother code length, and determining a subchannel corresponding to a sequence number that belongs to the pre-frozen sequence or is greater than the mother code length as the pre-frozen subchannel, where for example, a bit is set to 0, to indicate that a subchannel corresponding to the bit is the pre-frozen subchannel, or a bit is set to 1, to indicate that a subchannel corresponding to the bit is the non-pre-frozen subchannel; and determining a non-pre-frozen subchannel in the pre-selected subchannel corresponding to the information bit as the subchannel corresponding to the information bit.

For example, an example in which a length of a sending sequence is 14, a quantity of information bits is 6, and the Z sequence is [0 1 2 5 3 6 7 11 4 8 9 12 10 13 14 15] whose length is 16 is used. Assuming that a first threshold determined by the communication apparatus is 8, the pre-frozen sequence is [14 15], and the readout degree of parallelism X of the Z sequence is 4, the communication apparatus respectively reads [0 1 2 5], [3 6 7 11], [4 8 9 12], and [10 13 14 15] for four times. The communication apparatus compares four content values read each time with the first threshold 8. In response to the four content values being greater than or equal to a corresponding information bit of the first threshold, the communication apparatus determines that information bits and frozen bits that are constructed based on the Z sequence are [F F F F], [F F F I], [F I I I], and [I I I I], where F indicates a frozen bit, and I indicates an information bit. The communication apparatus alternatively respectively reads sequence numbers corresponding to content values for four times, and compare the sequence numbers with the pre-frozen sequence. Because the sequence numbers [14 15] belong to the pre-frozen sequence, bits corresponding to the sequence numbers [14 15] are changed to frozen bits. In other words, the information bits and the frozen bits that are constructed based on the Z sequence are [F F F F], [F F F I], [F I I I], and [I I F F].

The X content values in the Z sequence and the sequence numbers corresponding to the X content values each time based on the readout degree of parallelism X of the Z sequence, the communication apparatus reads the X content values and the sequence numbers corresponding to the X content values based on an order of the sequence numbers, or reads any X content values and sequence numbers corresponding to the X content values from the Z sequence. This is not limited.

In addition, a larger readout degree of parallelism X of the Z sequence indicates a larger quantity of content values in the Z sequence and a larger quantity of sequence numbers that the communication apparatus reads at a time, and a faster processing speed, but higher costs. A smaller readout degree of parallelism X of the Z sequence indicates a smaller quantity of content values in the Z sequence and a smaller quantity of sequence numbers that the communication apparatus reads at a time, a slower processing speed, but lower costs. In an actual communication scenario, the readout degree of parallelism X of the Z sequence is properly determined based on a communication requirement of the communication scenario.

Optionally, in response to the communication apparatus determining the mother code length and the pre-frozen sequence based on the length of the sending sequence and the quantity of information bits, the quantity of information bits further includes at least one of the following: a cyclic redundancy check bit and a parity check (PC) bit. In other words, the quantity of information bits includes a payload of the sending sequence and at least one of the following: the cyclic redundancy check bit and the parity check bit.

For example, an example in which the quantity of information bits includes the parity check bit is used. The communication apparatus selects a location of the parity check bit and a quantity of parity check bits based on the payload of the sending sequence, and determine the quantity of information bits based on the quantity of parity check bits and the payload of the sending sequence.

In response to the subchannel corresponding to the information bit being a subchannel corresponding to the parity check bit or the cyclic redundancy check bit, the subchannel is changed from the subchannel corresponding to the information bit to a subchannel corresponding to the frozen bit.

Step 604: The communication apparatus performs polar coding on the information bit based on the subchannel corresponding to the information bit.

For specific descriptions that the communication apparatus performs polar coding on the information bit based on the subchannel corresponding to the information bit, refer to related descriptions in an existing communication protocol that the communication apparatus performs polar coding on the information bit after determining the subchannel corresponding to the information bit. Details are not described.

According to the method shown in FIG. 6, because content values in the reliability weight sequence are sorted based on the natural order, the content values in the reliability weight sequence are continuous, and are real physical locations of bits, a construction process is not recorded in a memory, to effectively reduce storage complexity, and values is directly assigned to continuous physical locations by using one addressing circuit. This reduces an area of a hardware circuit, overheads, and costs. In addition, this reduces a delay, and constructs a polar code by effectively using a parallel construction method.

According to the method shown in FIG. 6, the communication apparatus determines the first threshold according to the following Method 1 or Method 2.

Method 1: The communication apparatus determines the first threshold from the first correspondence based on the length of the sending sequence and the quantity of information bits.

The first correspondence includes the length of the sending sequence and the quantity of information bits, and the first threshold corresponding to the length of the sending sequence and the quantity of information bits.

For example, an example in which the first correspondence is a correspondence shown in Table 1 is used. In response to the length of the sending sequence being 14, and the quantity of information bits is 6, the communication apparatus determines, based on a first correspondence shown in Table 1, that the first threshold is 8. In response to the length of the sending sequence being 16, and the quantity of information bits is 6, the communication apparatus determines, based on a second correspondence described in Table 1, that the first threshold is 10.

TABLE 1

| Length of a sending sequence | Quantity of information bits | First threshold |
|---|---|---|
| 14 | 6 | 8 |
| 16 | 6 | 10 |

In response to a quantity of combinations of the length of the sending sequence and the quantity of information bits of the polar code that a communication system is to support being small, for example, is no more than 128 combinations, a value of the first threshold is stored in a form of the first correspondence based on different lengths of the sending sequence and quantities of information bits, so that the first threshold is determined by using the first correspondence in response to the polar code being constructed based on the Z sequence.

Figure 8:
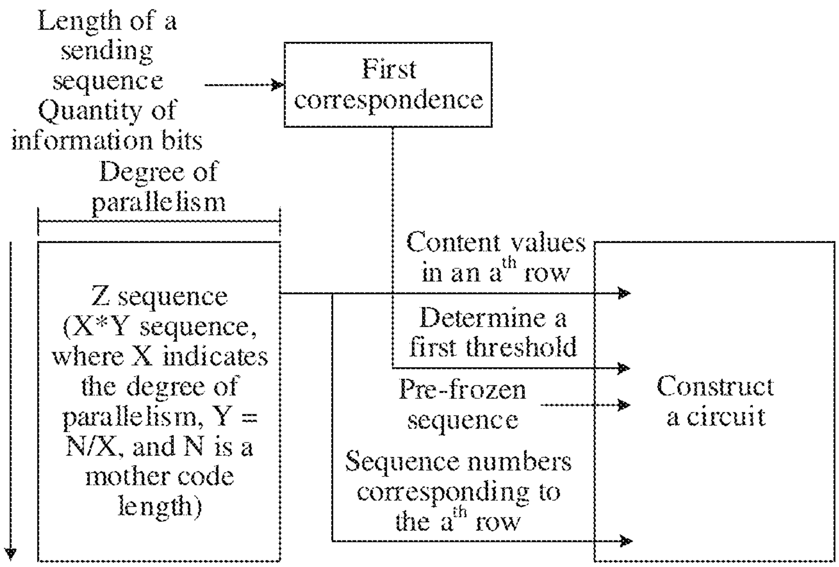
FIG. 8 is a schematic diagram of polar code construction according to at least one embodiment.

For example, as shown in FIG. 8, an example in which the mother code length is N, and the readout degree of parallelism X of the Z sequence is less than the mother code length N is used. The Z sequence is described as an X*Y sequence. The communication apparatus determines the first threshold from a prestored first correspondence based on the length of the sending sequence and the quantity of information bits, and at the same time, separately read the X content values in the N/X groups and the sequence numbers corresponding to the X content values. In addition, the communication apparatus performs the following processing shown in FIG. 7 on the X content values in the $a^{th}$ group and the sequence numbers corresponding to the X content values, where 0≤a≤N/X−1: separately comparing the X content values Za[0], Za[1], . . . , and Za[X−1] in the $a^{th}$ group with the first threshold, and pre-selecting a subchannel corresponding to a content value greater than or equal to the first threshold as the subchannel corresponding to the information bit, where for example, a bit is set to 1, to indicate that a subchannel corresponding to the bit is pre-selected as the subchannel corresponding to the information bit, or a bit is set to 0, to indicate that a subchannel corresponding to the bit is not pre-selected as the subchannel corresponding to the information bit; separately comparing the sequence numbers a*X, a*X+1, a*X+2, . . . , and (a+1)*X−1 that are corresponding to the X content values in the $a^{th}$ group with the pre-frozen sequence and the mother code length, and determining a subchannel corresponding to a sequence number that belongs to the pre-frozen sequence or is greater than the mother code length as the pre-frozen subchannel, where for example, a bit is set to 0, to indicate that a subchannel corresponding to the bit is the pre-frozen subchannel, or a bit is set to 1, to indicate that a subchannel corresponding to the bit is the non-pre-frozen subchannel; and determining a non-pre-frozen subchannel in the pre-selected subchannel corresponding to the information bit as the subchannel corresponding to the information bit.

Figure 9:
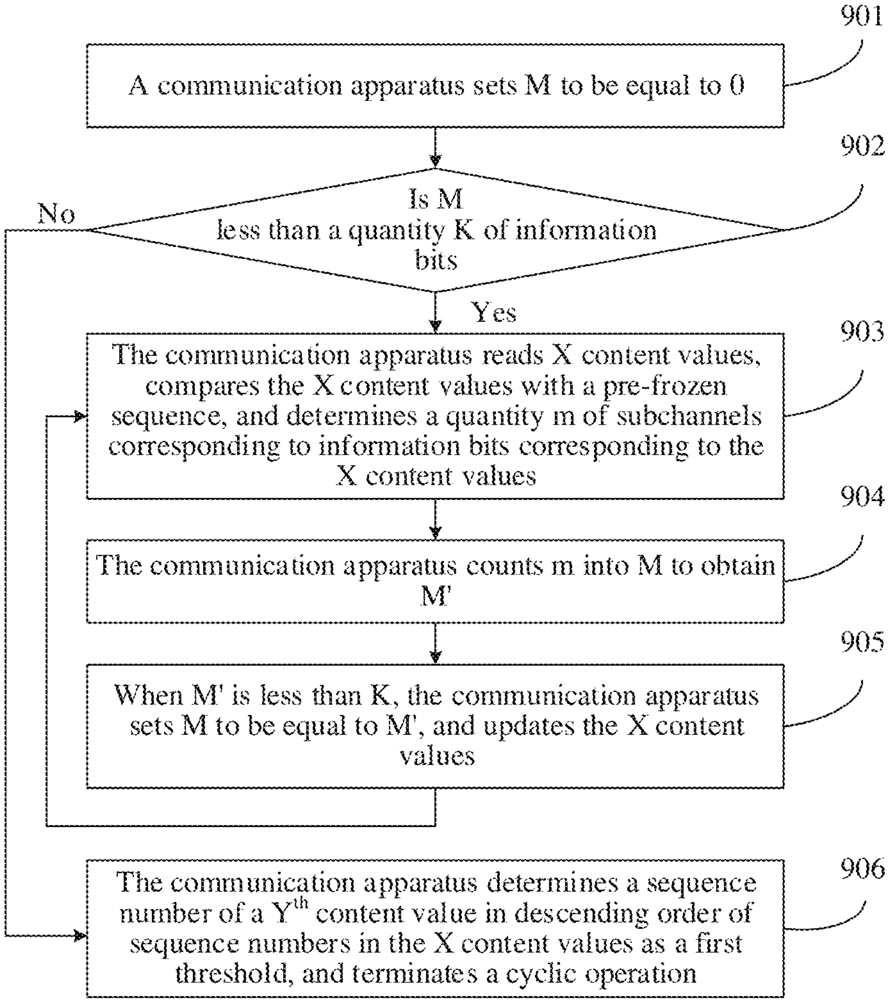
FIG. 9 is a flowchart of a method for determining a first threshold according to at least one embodiment.

Method 2: A communication apparatus determines a first threshold based on a Q sequence according to a method shown in FIG. 9. As shown in FIG. 9, the method includes the following steps.

Step 901: The communication apparatus sets M to be equal to 0.

For example, the communication apparatus sets M to be equal to 0 in a manner of initializing a value of a counting unit, for example, a counter, to 0.

Step 902: In response to M being less than a quantity K of information bits, the communication apparatus performs a cyclic operation shown in step 903 to step 905; or in response to M being greater than or equal to a quantity K of information bits, the communication apparatus performs step 906.

Step 903: The communication apparatus reads X content values, compares the X content values with a pre-frozen sequence, and determines a quantity m of subchannels corresponding to information bits corresponding to the X content values.

The X content values is a first group of X content values in the Q sequence.

For example, the communication apparatus determines a quantity of content values that are in the X content values and that are different from content values in the pre-frozen sequence as m.

Further, the communication apparatus determines a quantity of content values that are in the X content values, that are different from the content values in the pre-frozen sequence and that are less than or equal to a mother code length as m.

Optionally, in response to reading a content value in a Z sequence, the communication apparatus reading X content values in the Q sequence each time based on a readout degree of parallelism X of the Q sequence.

X is less than or equal to the mother code length. In response to X being equal to the mother code length, the communication apparatus reads each content value in the Q sequence at a time and separately compare each content value with the pre-frozen sequence. In response to X being less than the mother code length, the communication apparatus reads the X content values in the Q sequence each time until a condition shown in step 906 is met.

Optionally, X is an integer power of 2.

In response to reading the X content values in the Q sequence, the communication apparatus sequentially reads the X content values in the Q sequence. In addition, a readout degree of parallelism in the Z sequence is the same as or different from the readout degree of parallelism of the Q sequence.

Step 904: The communication apparatus counts m into M to obtain M', where $$M'=M+m.$$

Step 905: In response to M' being less than K, the communication apparatus sets M to be equal to M', and updates X content values.

Updated X content values is a next group of X content values in the Q sequence.

Step 906: In response to M' being greater than or equal to K, the communication apparatus determines a sequence number of a $Y^{th}$ content value in descending order of sequence numbers in the X content values as the first threshold, and terminates the cyclic operation, where $$Y=K-(M'-m).$$

Figure 10:
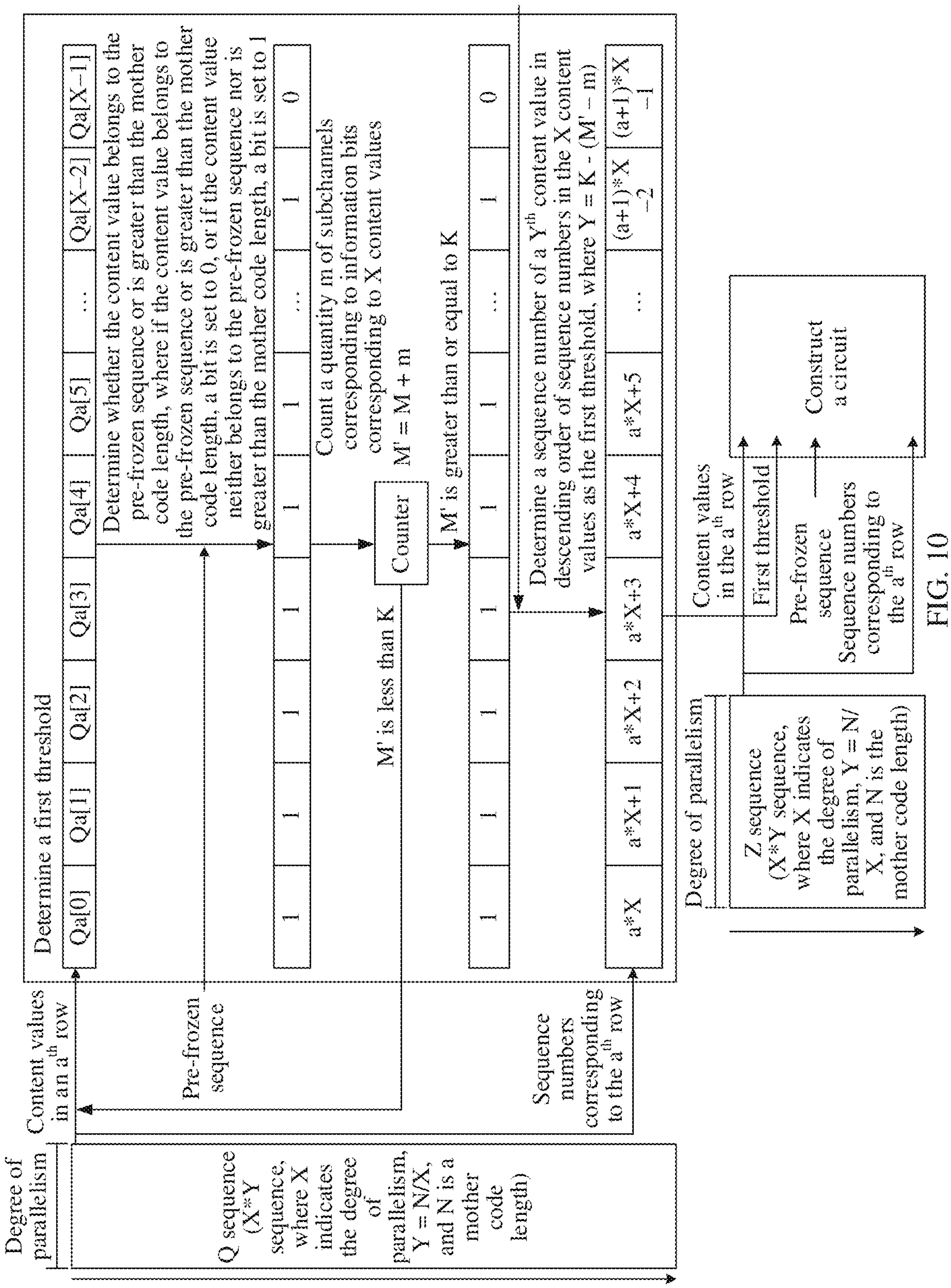
FIG. 10 is a schematic diagram of polar code construction according to at least one embodiment.

For example, as shown in FIG. 10, an example in which the mother code length is N, and the readout degree of parallelism X of the Q sequence is less than the mother code length N is used. The Q sequence is described as an X*Y sequence. The communication apparatus sequentially performs the following processing on X content values in an $a^{th}$ group and sequence numbers corresponding to the X content values, where 1≤a≤N/X: comparing the X content values Qa[0], Qa[1], . . . , and Qa[X−1] in the $a^{th}$ group with the pre-frozen sequence and the mother code length, and determining whether the content value belongs to the pre-frozen sequence or is greater than the mother code length; and in response to the content value belonging to the pre-frozen sequence or being greater than the mother code length, determining a subchannel corresponding to the content value as a pre-frozen subchannel, or in response to the content value neither belongs to the pre-frozen sequence nor is greater than the mother code length, determining a subchannel corresponding to the content value as a subchannel corresponding to an information bit, where for example, a bit is set to 0, to indicate that a subchannel corresponding to the bit is the pre-frozen subchannel, or a bit is set to 1, to indicate that a subchannel corresponding to the bit is the subchannel corresponding to the information bit; counting the quantity m of subchannels corresponding to the information bits corresponding to the X content values in the $a^{th}$ group; and counting m into M, to obtain M', where in response to M' being less than K, the communication apparatus sets M to be equal to M', and updates the X content values, or in response to M' being greater than or equal to K, the communication apparatus determines the sequence number of the $Y^{th}$ content value in descending order of sequence numbers in the X content values as the first threshold, and terminates the cyclic operation.

Further, as shown in FIG. 7, the following processing is performed on the X content values in the $a^{th}$ group and the sequence numbers corresponding to the X content values, where 1≤a≤N/X: separately comparing the X content values Za[0], Za[1], . . . , and Za[X−1] in the $a^{th}$ group with the first threshold, and pre-selecting a subchannel corresponding to a content value greater than or equal to the first threshold as the subchannel corresponding to the information bit, where for example, a bit is set to 1, to indicate that a subchannel corresponding to the bit is pre-selected as the subchannel corresponding to the information bit, or a bit is set to 0, to indicate that a subchannel corresponding to the bit is not pre-selected as the subchannel corresponding to the information bit; separately comparing the sequence numbers a*X, a*X+1, a*X+2, . . . , and (a+1)*X−1 that are corresponding to the X content values in the $a^{th}$ group with the pre-frozen sequence and the mother code length, and determining a subchannel corresponding to a sequence number that belongs to the pre-frozen sequence or is greater than the mother code length as the pre-frozen subchannel, where for example, a bit is set to 0, to indicate that a subchannel corresponding to the bit is the pre-frozen subchannel, or a bit is set to 1, to indicate that a subchannel corresponding to the bit is the non-pre-frozen subchannel; and determining a non-pre-frozen subchannel in the pre-selected subchannel corresponding to the information bit as the subchannel corresponding to the information bit.

In response to a quantity of combinations of a length of a sending sequence and the quantity of information bits of a polar code that a communication system is to support being large, compared with determining the first threshold based on the first correspondence shown in Method 1, determining the first threshold according to Method 2 avoids that in response to the quantity of combinations of the length of the sending sequence and the quantity of information bits being uncontrollable, excessive overheads of the Z sequence are caused by excessively numerous offline computing first thresholds. This reduces storage overheads and reduces costs.

Further, according to the polar code construction method shown in FIG. 6 to FIG. 10, the method is further applied to a data channel incremental redundancy hybrid automatic repeat request (incremental redundancy hybrid automatic repeat request, IR-HARQ) mode in an in-vehicle short-range wireless communication system technical requirement (which is referred to as a Green Tooth for short) protocol of the China Communications Standards Association (CCSA), and is used to construct an information bit and a copied bit.

The communication apparatus determines, according to the polar code construction method, a subchannel I_map corresponding to an information bit in a first transmission and a subchannel I_map_ir corresponding to an information bit in a second transmission, and determine a subchannel corresponding to a copied bit in the second transmission, based on the subchannel corresponding to the information bit in the first transmission and the subchannel corresponding to the information bit in the second transmission.

In response to a bit being an information bit in the first transmission, a bit is a frozen bit in the second transmission, the bit is a copied bit. In response to a bit being a frozen bit in the first transmission, and a bit is an information bit in the second transmission, the information bit in the second transmission is converted into the frozen bit. In response to a bit being an information bit or a frozen bit in both first transmission and the second transmission, the bit remains unchanged.

For example, the communication apparatus constructs the information bit and the copied bit according to a method shown in FIG. 11. As shown in FIG. 11, the method includes the following steps.

Step 1101: A communication apparatus determines a mother code length N0 and a pre-frozen sequence P0 in an initial transmission based on a length E0 of a sending sequence and a quantity K of information bits in the initial transmission.

Step 1102: The communication apparatus determines a pre-frozen sequence P1 in a retransmission based on a length E1 of a sending sequence in the retransmission, the length E0 of the sending sequence in the initial transmission, and the mother code length N0 in the initial transmission, and combines the pre-frozen sequence P1 in the retransmission and the pre-frozen sequence in the initial transmission into P2, where $$P2[i+N0]=P0[i], P0[i]=P1[i], \text{ and } i<N0.$$

In step 1101 and step 1102, for specific descriptions that the communication apparatus determines the mother code length N0 and pre-frozen sequence P0 in the initial transmission, determines the pre-frozen sequence P1 in the retransmission, and combines the pre-frozen sequence P1 in the retransmission and the pre-frozen sequence in the initial transmission into P2, refer to related descriptions in an existing communication protocol. Details are not described.

Step 1103: The communication apparatus determines a first threshold 1 in the initial transmission based on E0, K, N0, and P0.

Step 1104: The communication apparatus determines a first threshold 2 in the retransmission based on E1, K, N1, and P2.

The first threshold 1 and the first threshold 2 is determined with reference to the foregoing descriptions of the first threshold. Details are not described.

An order of performing step 1103 and step 1104 is not limited. The communication apparatus first performs step 1103 and then perform step 1104, first performs step 1104 and then perform step 1103, or simultaneously performs step 1103 and step 1104.

Step 1105: The communication apparatus determines a subchannel corresponding to the information bit in the initial transmission based on the first threshold 1, and maps the information bit to a high half region of a mother code length in the retransmission.

I_map_ir_high_init[i+N0]=I_map [i], where Lmap_n-_high_init indicates the high half region of the mother code length in the retransmission, and I_map indicates the information bit in the initial transmission.

The high half region of the mother code length in the retransmission is N0 to 2*N0−1.

Step 1106: The communication apparatus determines a subchannel corresponding to an information bit in the retransmission based on the first threshold 2.

The subchannel corresponding to the information bit corresponding to the retransmission is a non-pre-frozen subchannel corresponding to a content value greater than or equal to the first threshold 2 corresponding to the retransmission in the Z sequence.

Step 1107: The communication apparatus sets a copied bit I_copy to 0 in a region in which I=0 to N−1, to 1 in a region in which I=N to 2*N−1 is I_map_ir_high_initli1==1& I_map_ir[i]==0, and to 0 in a remaining region.

According to the method shown in FIG. 11, the polar code construction method provided in at least one embodiment is alternatively used for constructing the information bit and the copied bit. This reduces the delay, and constructs the polar code by effectively using the parallel construction method.

The foregoing mainly describes the solutions provided in at least one embodiment from a perspective of interaction between devices. To implement the foregoing functions, the devices include hardware structures and/or software modules corresponding to the functions. A person of ordinary skill in the art should easily be aware that, in combination with algorithms and steps in examples described in embodiments disclosed in at least one embodiment, at least one embodiment is implemented by hardware or a combination of hardware and computer software. Whether a function is performed by the hardware or the hardware driven by the computer software depends on particular applications and design constraints of the technical solutions. A person skilled in the art uses different methods to implement the described functions for each particular application, but the implementation is not considered to go beyond the scope of embodiments described herein.

In at least one embodiment, the devices is divided into functional modules based on the foregoing method examples. For example, each functional module corresponding to each function is obtained through division, or two or more functions is integrated into one processing module. The integrated module is implemented in a form of hardware, or is implemented in a form of a software functional module. In at least one embodiment, module division is an example, and is merely a logical function division. In actual implementation, another division manner is used.

In response to each functional module corresponding to each function being obtained through division, FIG. 12 shows a communication apparatus. The communication apparatus 120 includes an input module 1201, an output module 1203, and a processing module 1202. For example, the communication apparatus 120 is a communication apparatus, or is a chip applied to a communication apparatus or another combined device or component having a function of the foregoing communication apparatus. In response to the communication apparatus 120 being the communication apparatus, the input module 1201 and the output module 1203 is transceivers. The transceiver includes an antenna, a radio frequency circuit, and the like. The processing module 1202 is a processor (or a processing circuit), for example, a baseband processor. The baseband processor includes one or more CPUs. In response to the communication apparatus 120 being the component having the function of the foregoing communication apparatus, the input module 1201 and the output module 1203 is radio frequency units. The processing module 1202 is a processor (or a processing circuit), for example, a baseband processor. In response to the communication apparatus 120 being a chip system, the input module 1201 and the output module 1203 is input/output interfaces of a chip (for example, a baseband chip). The processing module 1202 is a processor (or a processing circuit) of the chip system, and includes one or more central processing units. The input module 1201 and the output module 1203 in at least one embodiment is implemented by a transceiver or a transceiver-related circuit component. The processing module 1202 is implemented by a processor or a processor-related circuit component (or referred to as a processing circuit).

For example, the input module 1201 and the output module 1203 is configured to perform all transmitting and receiving operations performed by the communication apparatus in embodiments shown in FIG. 6 to FIG. 11, and/or configured to support another process of a technology described in at least one embodiment. The processing module 1202 is configured to perform all operations performed by the communication apparatus in embodiments shown in FIG. 6 to FIG. 11 other than the transmitting and receiving operations, and/or configured to support another process of the technology described in at least one embodiment.

In at least one embodiment, the input module 1201 and the output module 1203 in FIG. 12 is replaced with a transceiver, and the transceiver integrates functions of the input module 1201 and the output module 1203. The processing module 1202 is replaced with a processor, and the processor integrates a function of the processing module 1202. Further, the communication apparatus 120 shown in FIG. 12 further includes a memory. In response to the input module 1201 and the output module 1203 being replaced with the transceiver, and the processing module 1202 is replaced with the processor, the communication apparatus 120 in at least one embodiment is the communication apparatus shown in FIG. 5.

At least one embodiment further provides a communication apparatus, including an interface circuit and a logic circuit. The interface circuit is configured to input and/or output information. The logic circuit is configured to perform all or a part of the procedures in the foregoing method embodiments, and perform processing based on the input information and/or generate output information.

At least one embodiment further provides a computer-readable storage medium. All or a part of the procedures in the foregoing method embodiments is completed by a computer program instructing related hardware. The program or a corresponding program product is stored in the computer-readable storage medium. In response to the program being executed, the procedures in the foregoing method embodiments is included. The computer-readable storage medium is an internal storage unit of the terminal (including a data transmitting end and/or a data receiving end) in any one of the foregoing embodiments, for example, a hard disk drive or a memory of the terminal. Alternatively, the computer-readable storage medium is an external storage device of the terminal, for example, a plug-in hard disk drive, a smart memory card (SMC), a secure digital (SD) card, or a flash card that are configured on the terminal. Further, the computer-readable storage medium alternatively includes both the internal storage unit of the terminal and the external storage device of the terminal. The computer-readable storage medium is configured to store the computer program and another program and data that are needed by the terminal. The computer-readable storage medium is further configured to temporarily store data that has been output or is to be output.

In the claims, and accompanying drawings, the terms "first", "second", and the like are intended to distinguish between different objects but do not describe a particular order. In addition, the terms "including", "having", and any other variant thereof are intended to cover a non-exclusive inclusion. For example, a process, a method, a system, a product, or a device that includes a series of steps or units is not limited to the listed steps or units, but optionally further includes an unlisted step or unit, or optionally further includes another inherent step or unit of the process, the method, the product, or the device.

In at least one embodiment, "at least one (item)" means one or more, "a plurality of" means two or more than two, "at least two (items)" means two, three, or more than three, and "and/or" is used for describing an association relationship between associated objects, and indicates that there is three relationships. For example, "A and/or B" indicates that only A exists, only B exists, and both A and B exist, where A and B is singular or plural. The character "I" usually indicates an "or" relationship between the associated objects. "At least one of the following items (pieces)" or a similar expression thereof refers to any combination of these items, including any combination of singular items (pieces) or plural items (pieces). For example, at least one (piece) of a, b, or c indicates a, b, c, "a and b", "a and c", "b and c", or "a, b, and c", where a, b, and c is singular or plural.

The foregoing descriptions about implementations allow a person skilled in the art to understand that, for the purpose of convenient and brief description, division of the foregoing functional modules is used as an example for illustration. In actual application, the foregoing functions is allocated to different modules and implemented based on a requirement. In other words, an inner structure of an apparatus is divided into different functional modules to implement all or a part of the functions described above.

In the several embodiments provided in at least one embodiment, the disclosed apparatus and method is implemented in other manners. For example, the described apparatus embodiment is merely an example. For example, the module or unit division is merely logical function division, and is another division in actual implementation. For example, a plurality of units or components is combined or integrated into another apparatus, or some features is ignored or not performed. In addition, the displayed or discussed mutual couplings or direct couplings or communication connections is implemented by using some interfaces. The indirect couplings or communication connections between the apparatuses or units is implemented in electronic, mechanical, or another form.

The units described as separate components may or may not be physically separate, and components displayed as units is one or more physical units, that is, is located in one place, or is distributed on a plurality of different places. A part of or all of the units is selected based on actual requirements to achieve the objectives of the solutions of embodiments.

In addition, functional units in at least one embodiment is integrated into one processing unit, each of the units exists alone physically, or two or more units are integrated into one unit. The integrated unit is implemented in a form of hardware, or is implemented in a form of a software functional unit.

In response to the integrated unit being implemented in the form of the software functional unit, and sold or used as an independent product, the integrated unit is stored in one readable storage medium. Based on such an understanding, the technical solutions of at least one embodiment essentially, or the part contributing to a conventional technology, or all or a part of the technical solutions is implemented in a form of a software product. The software product is stored in a storage medium and includes several instructions for enabling a device (which is a single-chip microcomputer, a chip, or the like) or a processor to perform all or a part of the steps of the methods described in at least one embodiment. The foregoing storage medium includes any medium that stores program code, for example, a USB flash drive, a removable hard disk drive, a ROM, a RAM, a magnetic disk, or an optical disc.

The foregoing descriptions are merely specific implementations of at least one embodiment, but are not intended to limit the protection scope of at least one embodiment. Any variation or replacement within the technical scope disclosed in at least one embodiment shall fall within the protection scope of at least one embodiment. Therefore, the protection scope of at least one embodiment shall be subject to the protection scope of the claims.

What is claimed is:

1. A polar code construction method, comprising:

obtaining, by a communication apparatus, a reliability weight sequence;

determining, by the communication apparatus, a first threshold, wherein the first threshold indicates a weight of lowest reliability of a subchannel corresponding to an information bit;

determining, by the communication apparatus, the subchannel corresponding to the information bit based on the first threshold, wherein the subchannel corresponding to the information bit is a non-pre-frozen subchannel corresponding to a content value greater than or equal to the first threshold in the reliability weight sequence; and performing, by the communication apparatus, polar coding on the information bit based on the subchannel corresponding to the information bit.

2. The polar code construction method according to claim 1, wherein the determining, by the communication apparatus, a first threshold includes:

determining, by the communication apparatus, the first threshold from a first correspondence based on a length of a sending sequence and a quantity of information bits, wherein the first correspondence includes the length of the sending sequence, the quantity of information bits, and the first threshold corresponding to the length of the sending sequence and the quantity of information bits.

3. The polar code construction method according to claim 1, wherein the determining, by the communication apparatus, a first threshold includes:

setting, by the communication apparatus, M to be equal to 0;

when M is less than the quantity K of information bits, performing, by the communication apparatus, the following cyclic operation:

reading, by the communication apparatus, X content values, comparing the X content values with a pre-frozen sequence, and determining a quantity m of subchannels corresponding to information bits corresponding to the X content values, wherein the X content values are a first group of X content values in a reliability ranking sequence;

counting, by the communication apparatus, m into M to obtain M', wherein M'=M+m; and when M' is less than K, setting, by the communication apparatus, M to be equal to M', and updating the X content values, wherein updated X content values are a next group of X content values in the reliability ranking sequence; or when M' is greater than or equal to K, determining, by the communication apparatus, a sequence number of a $Y^{th}$ content value in descending order of sequence numbers in the X content values as the first threshold, and terminating the cyclic operation, wherein Y=K−(M'−m).

4. The polar code construction method according to claim 3, the reading, by the communication apparatus, X content values, comparing the X content values with a pre-frozen sequence, and determining a quantity m of subchannels corresponding to information bits corresponding to the X content values includes:

determining, by the communication apparatus, a quantity of content values that are in the X content values and that are different from content values in the pre-frozen sequence as m.

5. The polar code construction method according to claim 2, wherein the determining, by the communication apparatus, the first threshold from a first correspondence based on a length of a sending sequence and the quantity of information bits includes determining the first threshold from a first correspondence based on a length of a sending sequence and at least one of the following: a cyclic redundancy check bit or a parity check bit.

6. The polar code construction method according to claim 1, wherein the method further comprises:

determining, by the communication apparatus, a first threshold corresponding to a retransmission process;

determining, by the communication apparatus, the subchannel corresponding to the information bit corresponding to the retransmission process based on the first threshold corresponding to the retransmission process, wherein the subchannel corresponding to the information bit corresponding to the retransmission process is a non-pre-frozen subchannel corresponding to a content value greater than or equal to the first threshold corresponding to the retransmission process in the reliability weight sequence; and performing, by the communication apparatus, polar coding on the information bit corresponding to the retransmission process based on the subchannel corresponding to the information bit corresponding to the retransmission process.

7. A communication apparatus, comprising:

at least one processor, and the at least one processor is configured to run a computer program or instructions, to cause the processor to:

obtain a reliability weight sequence;

determine a first threshold, wherein the first threshold indicates a weight of lowest reliability of a subchannel corresponding to an information bit;

determine the subchannel corresponding to the information bit based on the first threshold, wherein the subchannel corresponding to the information bit is a non-pre-frozen subchannel corresponding to a content value greater than or equal to the first threshold in the reliability weight sequence; and perform polar coding on the information bit based on the subchannel corresponding to the information bit.

8. The communication apparatus according to claim 7, wherein the at least one processor is further configured to:

determine the first threshold from a first correspondence based on a length of a sending sequence and a quantity of information bits, wherein the first correspondence comprises the length of the sending sequence, the quantity of information bits, and the first threshold corresponding to the length of the sending sequence and the quantity of information bits.

9. The communication apparatus according to claim 7, wherein the at least one processor is further configured to:

set M to be equal to 0;

when M is less than a quantity K of information bits, perform the following cyclic operation:

reading X content values, comparing the X content values with a pre-frozen sequence, and determining a quantity m of subchannels corresponding to information bits corresponding to the X content values, wherein the X content values are a first group of X content values in a reliability ranking sequence; and count m into M to obtain M', wherein M'=M+m; and when M' is less than K, set M to be equal to M', and update the X content values, wherein updated X content values are a next group of X content values in the reliability ranking sequence; or when M' is greater than or equal to K, determine, a sequence number of a $Y^{th}$ content value in descending order of sequence numbers in the X content values as the first threshold, and terminate the cyclic operation, wherein Y=K−(M'−m).

10. The communication apparatus according to claim 9, wherein the at least one processor is further configured to:

determine a quantity of content values that are in the X content values and that are different from content values in the pre-frozen sequence as m.

11. The communication apparatus according to claim 8, wherein the quantity of information bits comprises at least one of the following: a cyclic redundancy check bit and a parity check bit.

12. The communication apparatus according to claim 7, wherein the at least one processor is further configured to:

determine a first threshold corresponding to a retransmission process;

determine the subchannel corresponding to the information bit corresponding to the retransmission process based on the first threshold corresponding to the retransmission process, wherein the subchannel corresponding to the information bit corresponding to the retransmission process is a non-pre-frozen subchannel corresponding to a content value greater than or equal to the first threshold corresponding to the retransmission process in the reliability weight sequence; and perform polar coding on the information bit corresponding to the retransmission process based on the subchannel corresponding to the information bit corresponding to the retransmission process.

13. The communication apparatus according to claim 7, wherein the communication apparatus further comprises a memory, and the memory is configured to store the computer program or the instructions.

14. A non-transitory computer-readable storage medium, wherein the computer-readable storage medium stores computer instructions or a program, and in response to the computer instructions or the program being run on a computer, the computer is enabled to:

obtain a reliability weight sequence;

determine a first threshold, wherein the first threshold indicates a weight of lowest reliability of a subchannel corresponding to an information bit;

determine the subchannel corresponding to the information bit based on the first threshold, wherein the subchannel corresponding to the information bit is a non-pre-frozen subchannel corresponding to a content value greater than or equal to the first threshold in the reliability weight sequence; and perform polar coding on the information bit based on the subchannel corresponding to the information bit.

15. The non-transitory computer-readable storage medium according to claim 14, wherein the computer is further enabled to:

determine the first threshold from a first correspondence based on a length of a sending sequence and a quantity of information bits, wherein the first correspondence comprises the length of the sending sequence, the quantity of information bits, and the first threshold corresponding to the length of the sending sequence and the quantity of information bits.

16. The non-transitory computer-readable storage medium according to claim 14, wherein the computer is further enabled to:

set M to be equal to 0;

when M is less than a quantity K of information bits, perform the following cyclic operation:

reading X content values, comparing the X content values with a pre-frozen sequence, and determining a quantity m of subchannels corresponding to information bits corresponding to the X content values, wherein the X content values are a first group of X content values in a reliability ranking sequence; and count m into M to obtain M', wherein M'=M+m; and when M' is less than K, set M to be equal to M', and update the X content values, wherein updated X content values are a next group of X content values in the reliability ranking sequence; or when M' is greater than or equal to K, determine, a sequence number of a $Y^{th}$ content value in descending order of sequence numbers in the X content values as the first threshold, and terminate the cyclic operation, wherein Y=K−(M'−m).

17. The non-transitory computer-readable storage medium according to claim 16, wherein the computer is further enabled to:

determine a quantity of content values that are in the X content values and that are different from content values in the pre-frozen sequence as m.

18. The non-transitory computer-readable storage medium according to claim 15, wherein the computer is further enabled to determine the first threshold from a first correspondence based on a length of a sending sequence and at least one of the following: a cyclic redundancy check bit and a parity check bit.

19. The non-transitory computer-readable storage medium according to claim 14, wherein the computer is further enabled to:

determine a first threshold corresponding to a retransmission process;

determine the subchannel corresponding to the information bit corresponding to the retransmission process based on the first threshold corresponding to the retransmission process, wherein the subchannel corresponding to the information bit corresponding to the retransmission process is a non-pre-frozen subchannel corresponding to a content value greater than or equal to the first threshold corresponding to the retransmission process in the reliability weight sequence; and perform polar coding on the information bit corresponding to the retransmission process based on the subchannel corresponding to the information bit corresponding to the retransmission process.

* * * * *